United States Patent
Kakimoto et al.

(10) Patent No.: US 6,743,533 B1
(45) Date of Patent: Jun. 1, 2004

(54) OXIDE SUPERCONDUCTOR, MANUFACTURING METHOD THEREOF, AND BASE SUBSTRATE THEREFOR

(75) Inventors: Kazuomi Kakimoto, Tokyo (JP); Natsuro Hobara, Tokyo (JP); Teruo Izumi, Tokyo (JP); Yuh Shiohara, Tokyo (JP); Yuichi Nakamura, Tokyo (JP); Kazuya Ohmatsu, Osaka (JP); Koso Fujino, Osaka (JP)

(73) Assignees: Fujikura Ltd., Tokyo (JP); Tokyo Electric Power Company, Inc., Tokyo (JP); Railway Technical Research Institute, Tokyo (JP); Sumitomo Electric Industries, Ltd., Osaka (JP); International Superconductivity Technology Center, Tokyo (JP)

( * ) Notice: Subject to any disclaimer, the term of this patent is extended or adjusted under 35 U.S.C. 154(b) by 0 days.

(21) Appl. No.: 09/959,029

(22) PCT Filed: Apr. 17, 2000

(86) PCT No.: PCT/JP00/02475

§ 371 (c)(1),
(2), (4) Date: Dec. 11, 2001

(87) PCT Pub. No.: WO00/63926

PCT Pub. Date: Oct. 26, 2000

(30) Foreign Application Priority Data

Apr. 15, 1999 (JP) .......... 11-108610
Apr. 15, 1999 (JP) .......... 11-108611

(51) Int. Cl.[7] .......... H01B 12/00; H01F 6/00; H01L 39/00; H01L 39/24
(52) U.S. Cl. .......... 428/701; 505/237; 505/238; 505/434; 427/62

(58) Field of Search .......... 505/230, 237, 505/238, 430, 434, 440, 441, 445, 446, 729, 734, 736; 428/930, 699, 700, 701; 427/62, 419.2, 419.3, 376.4

(56) References Cited

U.S. PATENT DOCUMENTS

| | | | | | |
|---|---|---|---|---|---|
| 5,536,704 A | * | 7/1996 | Yamada et al. | .......... | 505/450 |
| 5,627,142 A | * | 5/1997 | Yamada et al. | .......... | 505/451 |
| 5,974,336 A | * | 10/1999 | Yamada et al. | .......... | 505/230 |
| 5,998,050 A | * | 12/1999 | Yamada et al. | .......... | 428/700 |
| 6,226,858 B1 | * | 5/2001 | Matsumoto et al. | .......... | 29/599 |
| 6,500,568 B1 | * | 12/2002 | Robbins | .......... | 428/670 |
| 6,537,689 B2 | * | 3/2003 | Schoop et al. | .......... | 428/701 |

FOREIGN PATENT DOCUMENTS

| | | |
|---|---|---|
| EP | 0 884 787 A2 | 12/1998 |
| JP | 2-44782 | 2/1990 |
| JP | 2-217306 | 8/1990 |
| JP | 4-50103 | 2/1992 |
| JP | 7-82078 | 3/1995 |
| JP | 11-3620 | 1/1999 |
| JP | 11-86647 | 3/1999 |

* cited by examiner

*Primary Examiner*—Stanley S. Silverman
*Assistant Examiner*—Colleen P. Cooke
(74) *Attorney, Agent, or Firm*—Bell, Boyd & Lloyd LLC

(57) ABSTRACT

An oxide superconductor of the present invention characterized in that it comprises: a substrate 1 made of metals having a high melting temperature; at least one oxide intermediate layer 2 and 3 which is formed on at least one surface of the substrate 1; and a thick film oxide superconductor layer 5 which is formed on the oxide intermediate layer 2 and 3 the liquid phase epitaxial method in which the substrate 1 provided with the oxide intermediate layer 2 and 3 is put into a solution 7 containing the elements comprising an oxide superconductor layer, and is then pulled out from the solution 7.

8 Claims, 6 Drawing Sheets

OXIDE SUPERCONDUCTOR, MANUFACTURING METHOD THEREOF, AND BASE SUBSTRATE THEREFOR

TECHNICAL FIELD

The present invention relates to an oxide superconductor which can be used for superconducting cables, superconducting magnets, current lead wires, and the like, a manufacturing method therefor, and a base substrate therefor. Specifically, the present invention relates to a technique in which an oxide superconductor layer is formed on an intermediate layer on a substrate using a liquid phase epitaxial method.

BACKGROUND ART

A superconductor oxide has an electric anisotropy such that an electrical current flows easily in a fixed direction and hardly flows in another fixed direction with respect to a crystallographic axis thereof. When an oxide superconductor is prepared using superconductor oxides, since the superconductor oxides have such electric anisotropy, a problem arises in that it is necessary to orientate crystals of the superconductor oxides in the fixed direction in which an electrical current flows.

In addition, since the superconductor oxide is one of ceramic, it has a low tolerance to bending or distortion. Therefore, in order to use the superconductor oxides for superconductors, such as superconductor wire, a thin film oxide superconductor layer is formed on a metallic substrate, such as a flexible tape.

In light of the above, as one example of means for forming the oxide superconductor layer on the metallic tape substrate, a vapor phase method, such as a laser evaporation method and a chemical vapor deposition (CVD) method, has been used.

In such a vapor phase method, an oxide superconductor layer having an excellent crystalline orientation can be prepared. However, for the vapor phase method, it is necessary to gradually deposit superconductor oxide crystals in a film manufacturing room, such as a chamber in a reduced pressure atmosphere, while the crystalline orientation of the superconductor oxide is observed. Therefore, the film formation rate is extremely low. For example, the film formation rate of the CVD method, which is believed to have a relatively high film formation rate is only about 0.01 $\mu m/min$. Therefore, it is difficult to stably prepare an oxide superconductor having a long length. If an oxide superconductor having a long length can be prepared, the required time for preparing is too long.

In addition, in view of a practical use of an oxide superconductor as a conductor, it is necessary to carry a high current; however, the oxide superconductor layer which is obtained by the vapor phase method has a thin film shape. In the vapor phase method, it is difficult to prepare an oxide superconductor layer having a sufficient thickness. Therefore, the vapor phase method has a problem in that it is difficult to prepare an oxide superconductor layer which can resist a high voltage.

Consequently, in the well-known vapor phase method, it is difficult to increase the thickness of the oxide superconductor layer and to carry a high current, and difficult to prepare the oxide superconductor layer at a high speed and to realize a high productivity.

Recently, a liquid phase epitaxial method has been suggested as a method which can prepare a thick film oxide superconductor layer at a high film formation rate.

The liquid phase epitaxial method is a method in which a solution having a similar composition to that of the objective superconductor oxide is used, a substrate is put into the solution, and is then gradually pulled up from the solution, and thereby an oxide superconductor layer is formed at the surface of the substrate where it is pulled up from the solution. In the liquid phase epitaxial method, a thick film oxide superconductor layer, of which the thickness is several tens of times as large as the thickness of the oxide superconductor layer prepared by a vapor phase method, can be prepared at a high film formation rate.

However, when a substrate in a tape shape is put into a solution in order to prepare an oxide superconductor layer on the substrate by the vapor phase epitaxial method, and the substrate is made of high heat resistant metals, but the metallic substrate reacts easily with components contained in the solution, there is a possibility that the substrate will dissolve into the solution. In addition, since the superconductor oxide is required to have an excellent crystalline orientation, when the components of the substrate dissolve into the solution, there is a possibility that elements which are not desired may contaminate the superconductor oxide. Due to this, there is a possibility that the crystalline structure of the superconductor oxide will remarkably deteriorate.

In consideration of the above, an object of the present invention is to provide an oxide superconductor comprising a thick film oxide superconductor layer on a substrate. In addition, another object of the present invention is to provide an oxide superconductor in which a substrate and a solution do not react when an oxide superconductor layer is prepared by the liquid phase epitaxial method, and which comprises a thick film oxide superconductor layer having an excellent crystalline orientation; and to provide a base substrate which is suitably used for preparing the oxide superconductor.

The present invention has an object of providing a manufacturing method for an oxide superconductor which can prepare a thick film oxide superconductor layer on a substrate at a film formation rate which is remarkably higher than that of an oxide superconductor layer formed by a vapor phase method. In addition, the present invention has another object of providing a manufacturing method for an oxide superconductor, in which when a substrate provided with an oxide intermediate layer is put into a solution and a raw oxide superconductor layer is prepared by a liquid phase epitaxial method, the raw oxide superconductor layer is prepared without damage to a substrate due to a solution.

In consideration of the above, the present invention has another object of providing an oxide superconductor which comprises a thick film oxide superconductor layer on a substrate and which has a high critical current.

In order to solve the above-mentioned problems, the present invention provides an oxide superconductor comprising: a substrate made of metals having a high melting temperature; at least one oxide intermediate layer which is formed on at least one surface of the substrate; and a thick film oxide superconductor layer which is formed on the oxide intermediate layer by the liquid phase epitaxial method in which the substrate provided with the oxide intermediate layer is put into a solution containing the elements comprising an oxide superconductor layer, and is then pulled out from the solution.

In the oxide superconductor, it is preferable for the oxide intermediate layer to comprise a first intermediate layer formed at the substrate side and a second intermediate layer formed at the oxide superconductor layer side; the first intermediate layer to be made of materials having a low reactivity to the substrate and the second intermediate layer; the second intermediate layer to be made of materials having a low reactivity to the first intermediate layer and the solution; and the thick film oxide superconductor layer to be prepared by being grown by the liquid phase epitaxial method from a seed layer for the superconductor oxides which is formed on the second intermediate layer.

In the oxide superconductor, it is also preferable for the substrate to be made of an Ni alloy or a Zr alloy; the first intermediate layer to be made of oxides containing a metal selected from the group consisting of Ni, Mg, Ba, and Zr; and the second intermediate layer to be made of oxides containing Ba.

In addition, it is preferable for the oxide superconductor to comprise a substrate which is made of an Ni alloy having a high melting temperature; a first intermediate layer which is made of MgO and is formed on the substrate; a second intermediate layer which is made of $BaZrO_3$ and is formed on the first intermediate layer; and an oxide superconductor layer which has a composition represented by the general formula $RE_{1+x}Ba_{2-x}Cu_3O_y$ wherein RE denotes at least one element selected from the group consisting of Y, Nd, Sm, Eu, Er, Dy, Gd, Ho, Tm, and Yb.

The present invention provides a base substrate for an oxide superconductor comprising: a substrate which is made of metals having a high melting temperature; a first intermediate layer which is formed on the substrate; and a second intermediate layer which is formed on the first intermediate layer, wherein the substrate is made of metals having a high melting temperature; the first intermediate layer is made of oxides which have a low reactivity to the elements comprising the substrate and the second intermnediate layer, and the second intermediate layer is made of oxides which have a low reactivity to the elements comprising the first intermediate layer, a heat resistance which is higher than that of the first intermediate layer, and a low reactivity to a solution for the superconductor oxides.

The present invention provides a manufacturing method for an oxide superconductor comprising the steps of: forming at least one oxide intermediate layer and a seed layer for the superconductor oxides on at least one surface of a substrate made of metals having a high melting temperature; carrying out the liquid phase epitaxial method in which the substrate provided with the oxide intermediate layer and the seed layer is put into a solution containing the elements comprising the oxide superconductor layer and is then pulled up from the solution, and thereby the seed layer grows on the oxide intermediate layer, and a raw oxide superconductor layer is formed; and heat treating the raw oxide superconductor layer, and thereby the raw oxide superconductor layer is converted into an oxide superconductor layer.

In the manufacturing method, it is preferable for the oxide intermediate layer to comprise a first intermediate layer which is formed on a substrate side and a second intermediate layer which is formed on a raw oxide superconductor layer side; the first intermediate layer to be made of materials which have a low reactivity to the substrate and the second intermediate layer; and the second intermediate layer to be made of materials which have a low reactivity to the solution.

In the manufacturing method, it is also preferable for the substrate to be made of an Ni alloy or a Zr alloy, the first intermediate layer to be made of oxides containing a metal selected from the group consisting of Ni, Mg, Ba, and Zr; and the second intermediate layer to be made of oxides containing Ba.

In addition, in the manufacturing method, it is preferable for the substrate to be made of an Ni alloy which has a high melting temperature; the first intermediate layer to be made of MgO; the second intermediate layer to be made of $BaZrO_3$; and the oxide superconductor layer to have a composition represented by the general formula REBaCuO, wherein RE denotes at least one element selected from the group consisting of Y, Nd, Sm, Eu, Er, Dy, Gd, Ho, Tm, and Yb.

In order to achieve the above-mentioned objects, the present invention provides another oxide superconductor comprising: a substrate which is made of metals having a high melting temperature; a main oxide intermediate layer which is formed on at least one surface of the substrate; a seed layer for the superconductor oxides which is formed on the main oxide intermediate layer; an oxide superconductor base layer which contains at least one element contained in the main oxide intermediate layer and is formed on the seed layer for the superconductor oxides by a liquid phase epitaxial method; and a thick film oxide superconductor layer which is formed on the oxide superconductor base layer by a liquid phase epitaxial method.

In the oxide superconductor, it is preferable for the main oxide intermediate layer to be made of MgO or NiO; and the oxide superconductor base layer which contains the elements comprising the main oxide intermediate layer to contain MgO or NiO.

In the oxide superconductor, it is preferable for the substrate to be made of an Ni alloy or a Zr alloy; and the main oxide intermediate layer to be made of oxides containing a metal selected from the group consisting of Ni, Mg, Ba, and Zr.

It is also preferable for the oxide superconductor layer to have a composition represented by the general formula REBaCuO, wherein RE denotes at least one element selected from the group consisting of Y, Nd, Sm, Eu, Er, Dy, Gd, Ho, Tm, and Yb.

The present invention provides another manufacturing method for an oxide superconductor comprising the steps of: forming a main oxide intermediate layer and a seed layer for the superconductor oxides on at least one surface of a substrate which is made of metals having a high melting temperature; carrying out the liquid phase epitaxial method in which the substrate provided with the main oxide intermediate layer and the seed layer is put into a solution containing the elements comprising both the superconductor oxides and the main oxide intermediate layer and is then pulled up from the solution and thereby a thin film oxide superconductor base layer is formed on the seed layer; carrying out the liquid phase epitaxial method in which the whole of the product prepared in these steps is put into a solution containing the elements comprising superconductor oxides and is then pulled up from the solution, and thereby a thick film raw oxide superconductor layer is formed on the oxide superconductor base layer; and heat treating the raw oxide superconductor layer and thereby the raw oxide superconductor layer is converted into a thick film oxide superconductor layer.

In the manufacturing method, it is preferable for the substrate to be made of an Ni alloy or a Zr alloy; and the main oxide intermediate layer to be made of oxides containing a metal selected from the group consisting of Ni, Mg, Ba, and Zr.

In addition, it is also preferable for the solution containing the elements comprising superconductor oxides and the main oxide intermediate layer to be prepared by adding the elements comprising the main oxide intermediate layer in a solution containing the elements comprising the superconductor oxides so as to reach saturation.

MODES FOR CARRYING OUT THE INVENTION

In the following, the present invention will be explained in detail. However, the present invention is not restricted to the following embodiments.
(First Embodiment)

Figure 1:
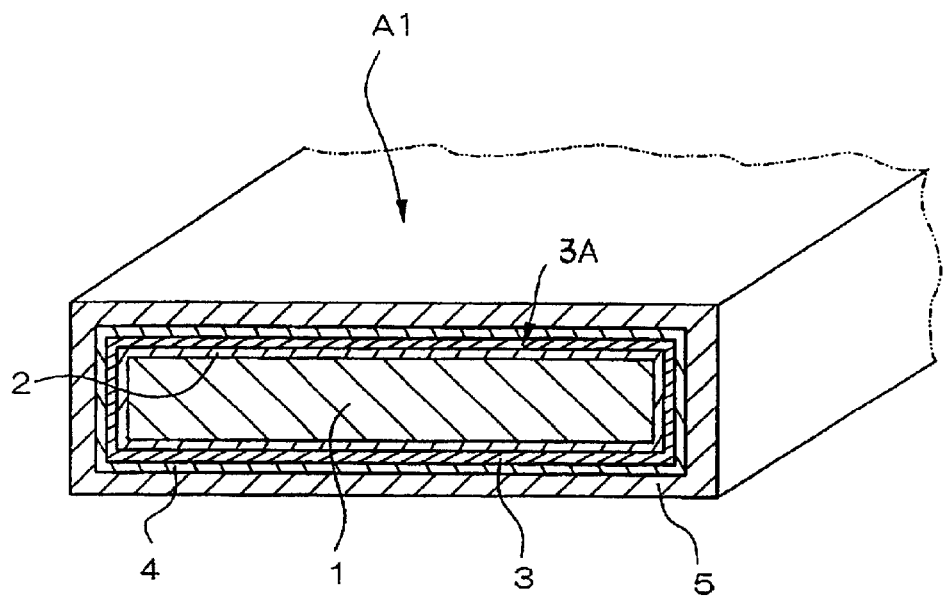
FIG. 1 is a cross sectional drawing showing a first embodiment of an oxide superconductor according to the present invention.

FIG. 1 is a cross sectional drawing showing a first embodiment of an oxide superconductor according to the present invention.

An oxide superconductor A1 mainly comprises a substrate 1 which has a tape shape and a large length, a first intermediate layer 2 and a second intermediate layer 3 which are formed in sequence on the periphery of the substrate 1 so as to cover the surface of the substrate 1, a seed film 4 for the superconductor oxides which is formed on the second intermediate layer 3 so as to cover the second intermediate layer 3, and a thick film oxide superconductor layer 5. In this embodiment, the first intermediate layer 2 and the second intermediate layer 3 comprise an oxide intermediate layer 3A.

The substrate 1 is made of metals which have a high heat resistance and a high melting temperature in a range of 1,000 to 2,000° C., for example, an Ni alloy containing a HASTELLOY alloy, such as an NiCr alloy, Ni, and Zr.

The HASTELLOY alloys are known as NiCr alloys which have an excellent high heat resistance and anti-oxidation properties, and are Ni alloys comprising Ni and an essential amount of additives, such as Mn, Fe, Co, Cr, Si, Fe, and W. Specifically, HASTELLOY A alloy which contains 20% by weight (abbreviated as "%" below) of Mo, 2.0% of Mn, 20% of Fe, and Ni as a remainder, HASTELLOY B alloy which contains 26–30% of Mo, 2.5% of Co, 1.0% of Cr, Mn, and Si, 4–7% of Fe, and Ni as a remainder, and HASTELLOY C alloy which contains 15–17% of Mo, 14.5–16.5% of Cr, 3–4.5% of W, 1.0% of Mn and Si, 4–7% of Fe, and Ni as a remainder are known. Any of these HASTELLOY alloys may be used. It is preferable for the substrate 1 to have a tape shape, a thickness in a range of about 0.05–0.5 mm, and flexibility.

It is preferable for the first intermediate layer 2 to be made of materials having a low reactivity to an Ni alloy, such as a HASTELLOY alloy, and Zr which comprise the substrate 1. For example, it is preferable for the first intermediate layer 2 to be made of MgO, NiO, and the like. The first intermediate layer 2 preferably has a low reactivity to the second intermediate layer 3. It is preferable for the first intermediate layer 2 to hardly react with the substrate 1 and the second intermediate layer 3 when it is put in a solution for the superconductor oxides and is heated at high temperatures, such as about 980–1,100° C.

In addition, when a HASTELLOY alloy comprising the substrate 1 is put into the solution for the superconductor oxides described below, in order to prevent, as much as possible, the substrate 1 from dissolving in the solution, it is preferable for the first intermediate layer 2 to be made of materials which have a similar crystalline structure to that of the superconductor oxides. Furthermore, it is preferable for the first intermediate layer 2 to have a lattice constant such that it can allow epitaxial growth of the crystals of the superconductor oxides, and to be used as a base film for preparing the superconductor oxides.

The second intermediate layer 3 is made of oxides, such as BaZrO which have a low reactivity to the first intermediate layer 2 when heated in a range of 980–1,100° C. as already explained.

In addition, it is necessary for the second intermediate layer 3 to have a low reactivity to the solution for the superconductor oxides described below as well as to the first intermediate layer 2, and to have a similar crystalline structure to that of the crystals of the superconductor oxides. However, the reactivity of the second intermediate layer 3 to the substrate 1 may be somewhat large. In this embodiment, since the first intermediate layer 2 is provided, the reactivity between the second intermediate layer 3 and the substrate 1 does not particularly cause a problem. As the materials which satisfy these requirements, $BaAlO_3$, $BaCeO_3$, and the like, may be used, other than $BaZrO_3$.

It is necessary for the seed film 4 for the superconductor oxides to be made of materials having the same composition as the superconductor oxides comprising the oxide superconductor layer 5 described below. Therefore, when the oxide superconductor layer 5 described below is made of materials containing Y, such as $Y_1Ba_2Cu_3O_y$, the seed film 4 is a thin film made of superconductor oxides containing Y, such as $Y_1Ba_2Cu_3O_y$. Moreover, the seed film 4 of this embodiment may be a film prepared by a vapor phase method.

The oxide superconductor layer 5 may be made of materials containing Y, such as $Y_1Ba_2Cu_3O_y$, or materials represented by $REBa_2Cu_3O_y$, which is obtained by replacing Y in the above-mentioned general formula with Nd, Sm, Eu, Er, Dy, Gd, Ho, Tm, or Yb. However, among these materials, materials containing Y, which are represented by the general formula $Y_1Ba_2CU_3O_y$, are useful. In addition, among materials containing Nd, materials represented by the general formula $Nd_{1+x}Ba_{2-x}Cu_3O_y$, are useful. Materials containing Nd have a critical temperature of 96 K, and a critical current density (Jc) in a high magnetic field which is higher than that of such materials containing Y. Therefore, the materials containing Nd are promising as materials to be used.

Figure 2:
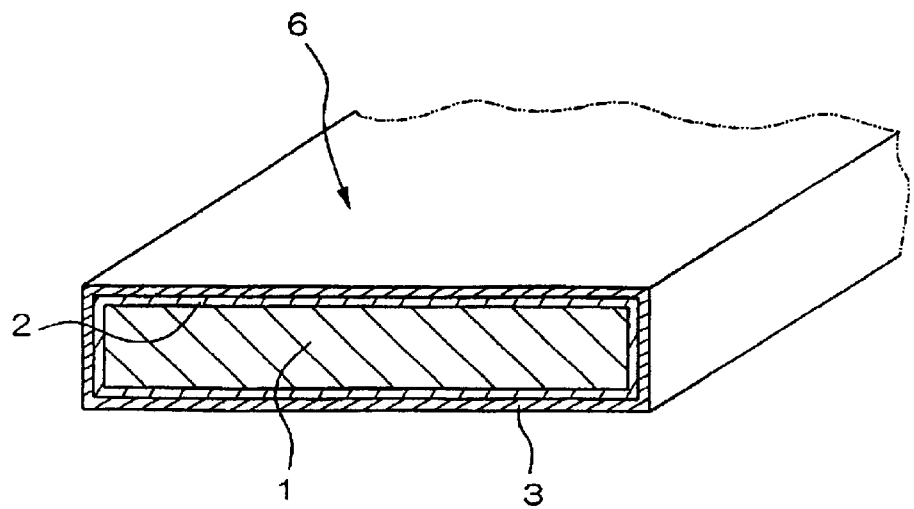
FIG. 2 is a cross sectional drawing showing an embodiment of a base substrate for an oxide superconductor according to the present invention.

In order to prepare the oxide superconductor layer 5, first, a base substrate 6 as shown in FIG. 2 is prepared. The base substrate 6 comprises the substrate 1, the first intermediate layer 2 which is formed on the periphery of the substrate 1, and the second intermediate layer 3 which is formed on the first intermediate layer 2.

In order to prepare the first and second intermediate layers 2 and 3 on the periphery of the substrate 1, a vapor phase method, such as the CVD method, the sputtering method, or the laser deposition method, is adopted. It is necessary for the first and the second intermediate layers 2 and 3 to have a thickness which is larger than that of the oxide superconductor layer 5 prepared in the following steps. In order to adjust the crystalline orientation of the oxide superconductor layer 5 and to prevent the substrate 1 and the first intermediate layer 2 from being damaged during immersion in the solution described below, the thickness of the first and second intermediate layers 2 and 3 may be in a range of about 0.1–3 µm. Therefore, for example, the thickness of the first and second intermediate layers 2 and 3 is adjusted to about 1 µm by a vapor phase method.

Figure 3:
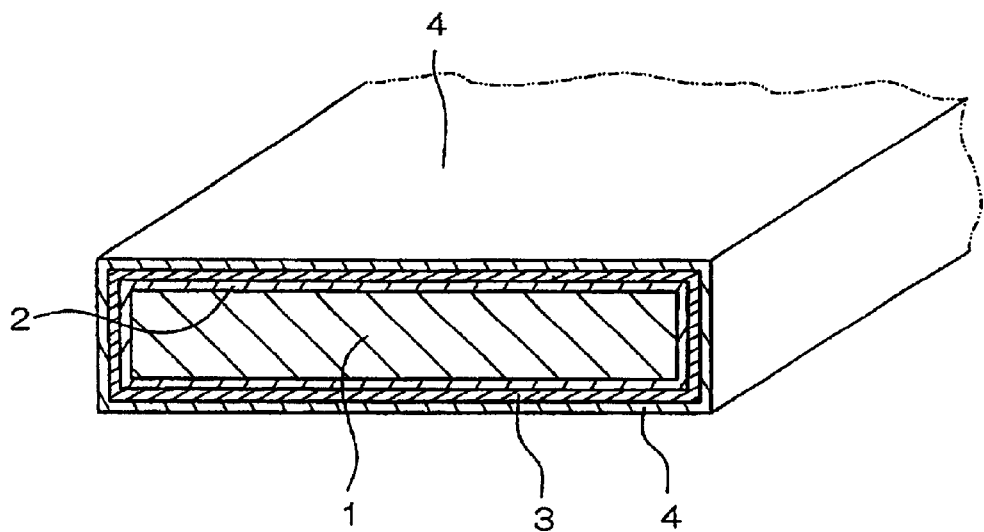
FIG. 3 is a cross sectional drawing showing the base substrate shown in FIG. 2 provided with a seed layer for the superconductor oxides.

Next, the seed film 4 for the superconductor oxides is formed on the periphery of the base substrate 6 by a vapor phase method, such as the CVD method, the sputtering method, or the laser deposition method, as shown in FIG. 3. This seed film 4 is a seed for growth when the thick film oxide superconductor layer is prepared from a solution by the liquid phase epitaxial method described below. Therefore, it is not necessary to increase the thickness of the seed film 4. The thickness may be in a range of about 0.01 µm (10 nm)–1 µm, which is easily formed by a vapor phase method. Therefore, the seed film 4 for the superconductor oxides, which has a well-oriented crystalline structure, can be easily formed on the base substrate 6 having a long length by the above-mentioned vapor phase method. It is necessary for the composition of the seed film 4 to be the same as that of the objective oxide superconductor layer 5. For example, when the oxide superconductor layer represented by $Y_1Ba_2Cu_3O_y$ is prepared by the liquid phase epitaxial method described below, it is necessary to adjust the composition of the seed film 4 to be $Y_1Ba_2Cu_3O_y$.

In order to form the oxide superconductor layer 5 on the seed film 4, the liquid phase epitaxial method is adopted, in which the base substrate 6 provided with the first and the second intermediate layers 2 and 3 and the seed film 4 is immersed into a solution for the superconductor oxides and is then pulled up from the solution.

Figure 4:
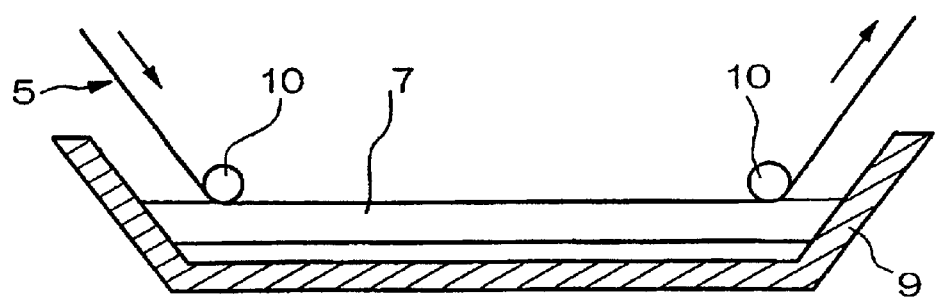
FIG. 4 shows the state of the liquid phase epitaxial method in which a base substrate in a tape shape is put into a solution and is then pulled up from the solution.

In order to carry out the liquid phase epitaxial method, for example, as shown in FIG. 4, a vessel 9 in a flat shape is filled with a solution 7 of which the composition is similar to that of the superconductor oxides, the base substrate 6 is put into the solution and is then gradually pulled up from the solution.

In order to form the oxide superconductor layer represented by $Y_1Ba_2Cu_3O_y$, for example, the solution 7 can be used, which is prepared by putting powder having a composition represented by $Y_2BaCuO_5$ (abbreviated as "Y211") at the bottom of the vessel 9, putting a mixture having a composition represented by $3BaCuO_2+2CuO$ on the powder, thereby adjusting the composition of the whole to be Y: Ba: Cu=6: 36: 58, and the whole is melted.

Next, the bottom part of the solution 7 is heated to about 1,010° C. and the surface of the solution 7 is slightly cooled to about 1,00020 C. A temperature difference of 10° C. is created between the surface temperature and the bottom temperature of the solution 7. The rollers 10 and 10 which are made of heat resistant materials are provided separately in the solution 7 near the surface of the solution 7. The base substrate 6 is set so as to pass through the upper part of the solution 7 via the rollers 10 and 10, and thereby the base substrate 6 is immersed into the solution 7. The rollers 10 and 10 may be made of $BaZrO_3$ and the like which comprise the second intermediate layer 3 having a low reactivity to the solution 7.

Due to this operation, the components of the solution 7 adhere to the surface of the base substrate 6 passing through the upper part of the solution 7, and a thick film raw oxide superconductor layer, of which the composition is represented by $Y_1Ba_2Cu_3O_{7-x}$ which has a well-ordered crystalline orientation, grows at the surface of the base substrate 6 using the seed film 4 as a seed crystal. This is because the bottom part of the solution 7 is a high temperature region and the upper part of the solution 7 is a low temperature region; therefore, a convective fluid flow is generated from the bottom to the top. When the supersaturated solution at the bottom part reaches the upper low temperature region, the supersaturated components selectively crystallize easily. When the base substrate 6 provided with the seed film 4 passes through the low temperature region, crystal growth from the seed film 4 is expedited.

The thick film raw oxide superconductor layer prepared by these steps is heated to 350–600°, and preferably it is heat treated in an oxygen atmosphere for several hours to several hundreds of hours. When the thick film raw oxide superconductor layer is heat treated, oxygen is sufficiently supplied to the raw oxide superconductor layer, and thereby the crystalline structure thereof is well-ordered. Thereby, the raw oxide superconductor layer is converted into the oxide superconductor layer 5. Based on these steps, the oxide superconductor A comprising the oxide superconductor layer 5 has an excellent crystalline orientation and a large thickness which substantially equals that of the oxide superconductor layer 5 shown in FIG. 1.

When the oxide superconductor layer 5 is formed by the liquid phase epitaxial method explained above, the thick film oxide superconductor layer 5 having a large thickness of about 2–10 µm can be formed remarkably quickly, for example, at a film formation rate of about 1 µm/min. Moreover, the film formation rate of the CVD method, which is known as a method having a relatively high film formation rate, is about 0.01 µm/min. Therefore, it is easily understood that the film formation rate of the liquid phase epitaxial method is remarkably high.

(Second Embodiment)

Figure 5:
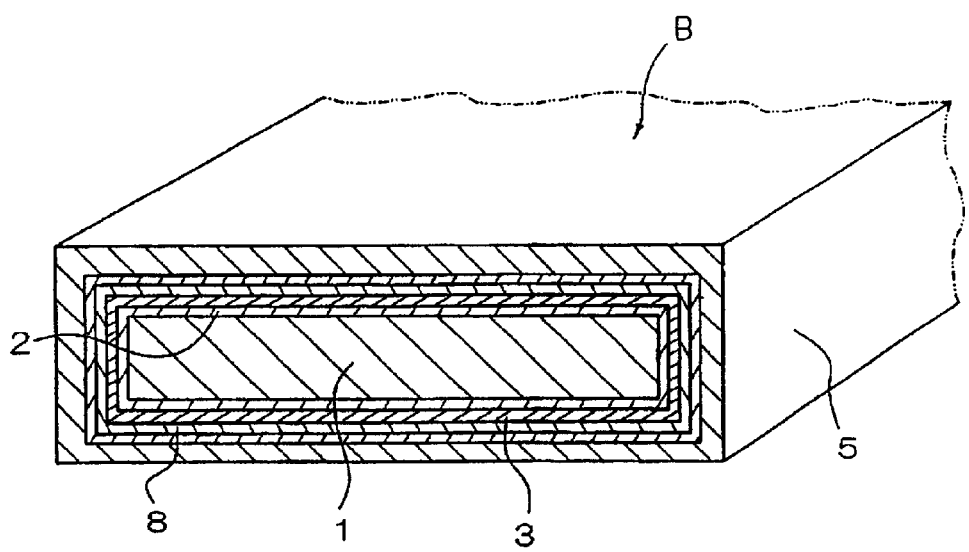
FIG. 5 is a cross sectional drawing showing a second embodiment of an oxide superconductor according to the present invention.

FIG. 5 is a cross sectional drawing showing a second embodiment of an oxide superconductor according to the present invention. An oxide superconductor B mainly comprises a substrate 1 which has a tape shape and a large length, a first intermediate layer 2 and a second intermediate layer 3 which are formed in sequence on the periphery of the substrate so as to cover the substrate 1, a third intermediate layer 8 which is formed on the second intermediate layer so as to cover the second intermediate layer 3, a seed film 4 for the superconductor oxides which is formed on the third intermediate layer 8 so as to cover the third intermediate layer 8, and an oxide superconductor layer 5.

In this embodiment, the first intermediate layer 2, the second intermediate layer 3, the seed film 4, and the oxide superconductor layer 5 are the same as those used in the superconductor A1 of the first embodiment.

The third intermediate layer 8 is made of oxides of Mg or Ni, such as MgO and NiO. That is, the third intermediate layer 8 is made of the same materials as those used in the first intermediate layer 2. MgO and NiO function as a base film which is suitably used for carrying out crystal growth of the seed layer 4 for the superconductor oxides thereon. However, since the reactivity to the solution 7 of MgO and NiO is a little larger than that of $BaZrO_3$ comprising the second intermediate layer 3, there is a possibility that they will be slightly damaged when they are put into the solution 7.

However, from the view of crystal growth due to the liquid phase epitaxial method which is carried out to prepare the raw oxide superconductor layer, the third intermediate layer 8 is superior to $BaZrO_3$ comprising the second intermediate layer 3. Therefore, in order to utilize this advantage and to preferentially expedite the crystal growth of the raw oxide superconductor layer when the liquid phase epitaxial method is carried out, the third intermediate layer 8 may be formed on the outermost of the intermediate layers. When the intermediate layer 8 is put into the solution 7, and when the intermediate layer 8 is slightly damaged due to some melting, since the seed film 4 for the superconductor oxides and the raw oxide superconductor layer are laminated on the third intermediate layer 8 in sequence so as to cover the third intermediate layer 8, the portions of the third intermediate layer 8 which have been slightly damaged are covered with the raw oxide superconductor layer. As a result, the superconductive property of the oxide superconductor B after heat treatment does not deteriorate.

The oxide superconductor B having a 3-layer structure, that is, comprising the first, second and third intermediate layers 2,3, and 8, shown in FIG. 5 is not disadvantageous to the superconductive property. Therefore, the intermediate layer may have a 3-layer structure as in this embodiment, a 2-layer structure as in the first embodiment, or a multiple layers structure, such as a structure having 4 or more layers.

(Third Embodiment)

Figure 6:
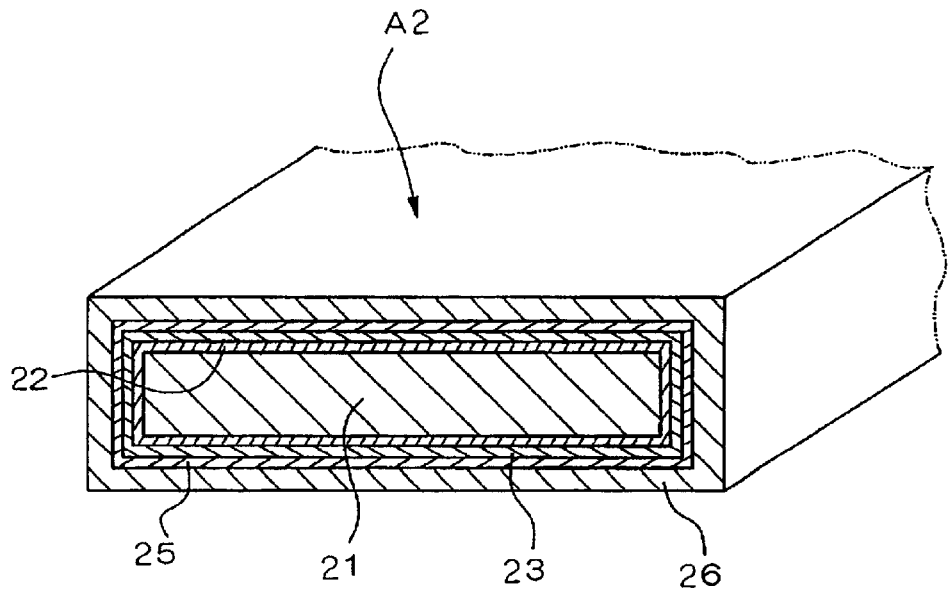
FIG. 6 is a cross sectional drawing showing a third embodiment of an oxide superconductor according to the present invention.

FIG. 6 is a cross sectional drawing showing a third embodiment of an oxide superconductor according to the present invention. An oxide superconductor A2 mainly comprises a substrate 21 which has a tape shape and a large length, a main oxide intermediate layer 22 which is formed on the periphery of the substrate 21 so as to cover the substrate 21, a seed layer 23 for the superconductor oxides which is formed on the main oxide intermediate layer 22 so as to cover the main oxide intermediate layer 22, an oxide superconductor base layer 25 which is formed on the seed layer 23 for the superconductor oxides so as to cover the seed layer 23, and a thick film oxide superconductor layer 26 which is formed on the oxide superconductor base layer 25 so as to cover the oxide superconductor base layer 25.

Moreover, in the figures, the main oxide intermediate layer 22, the seed layer 23 for the superconductor oxides, the oxide superconductor base layer 25, and the oxide superconductor layer 26 cover the entire periphery of the substrate 21. However, they may also be laminated only at the top surface or the bottom surface of the substrate 21.

The substrate 21 is made of metals having a high heat resistance and a high melting temperature in a range of about 1,000–2,000° C., for example, HASTELLOY alloys, such as an Ni alloy and an NiCr alloy, Ni, and Zr.

HASTELLOY alloys are known as an NiCr alloy which has excellent high heat resistance and anti-oxidation properties, and it is an Ni alloy comprising Ni and an essential amount of additives, such as Mn, Fe, Co, Cr, Si, Fe, and W. Specifically, HASTEBLJOY A alloy which contains 20% by weight (abbreviated as "%" below) of Mo, 20% of Mn, 20% of Fe, and Ni as a remainder, HASTELLOY B alloy which contains 26–30% of Mo, 2.5% of Co, 1.0% of Cr, Mn, and Si, 47% of Fe, and Ni as a remainder; and HASTELLOY C alloy which contains 15–17% of Mo, 14.5–16.5% of Cr, 34.5% of W, 1.0% of Mn and Si, 4–7% of Fe, and Ni as a remainder are known. Any of these HASTELLOY alloys may be used. It is preferable for the substrate 21 to have a tape shape which has a thickness in a range of about 0.055 mm and flexibility.

It is preferable for the main oxide intermediate layer 22 to be made of materials having a low reactivity, for example, HASTELLOY alloys, such as an Ni alloy and Zr, which comprise the substrate 21. For example, it is preferable for the main oxide intermediate layer 22 to be made of MgO, NiO, and the like.

In addition, when a HASTELLOY alloy comprising the substrate 1 is put into the solution for the superconductor oxides described below, in order to prevent, as much as possible, the substrate 1 from dissolving in the solution, it is preferable for the first intermediate layer 2 to be made of materials which have a similar crystalline structure to that of the superconductor oxides. Furthermore, it is preferable for the first intermediate layer 2 to have a lattice constant such that it can allow epitaxial growth of the crystals of the superconductor oxides, and to be used as a base film for preparing the superconductor oxides.

In order to prevent, as much as possible the substrate 21 from dissolving in a solution for the superconductor oxides when a HASTELLOY alloy comprising the substrate 21 is put into the solution, it is preferable for the main oxide intermediate layer 22 to be made of materials which can be used as a base film for preparing an oxide superconductor layer, which have a similar crystalline structure to that of the superconductor oxides and a lattice constant which can allow epitaxial growth of the crystals of the oxide superconductor. The thickness of the main oxide intermediate layer 22 is preferably in a range of 0.1–3 $\mu$m. Specifically the thickness can be adjusted to about 1 $\mu$m.

It is necessary for the seed film layer 23 for the superconductor oxides to have the same composition as that of the objective oxide superconductor layer 26. The seed layer 23 for the superconductor oxides may be made of materials containing Y, such as $Y_1Ba_2Cu_3O_y$, or materials represented by $REBa_2Cu_3O_y$, which is obtained by replacing by Y in the above-mentioned general formula with Nd, Sm, Eu, Er, Dy, Gd, Ho, Tm, or Yb. However, among these materials, materials containing Y, which are represented by the general formula $Y_1Ba_2Cu_3O_y$, are useful In addition, among materials containing Nd, materials which are represented by the general formula $Nd_{1+x}Ba_{2-x}Cu_3O_y$, are useful. Materials containing Nd have a critical temperature of 96 K, and a critical current density (Jc) in a high magnetic field which is higher than that of such materials containing Y; therefore, the materials containing Nd are promising as materials to be used. The seed layer 23 for the superconductor oxides is formed by a vapor phase method, such as the laser deposition method, the CVD method, the sputtering method, and the like. The thickness of the seed layer 23 is preferably in a range of about 0.01–1 $\mu$m, and more preferably about 1 $\mu$m.

The oxide superconductor base layer 25 contains the elements comprising the superconductor oxides which have a composition represented by the above-mentioned general formula and the main oxide intermediate layer 22. The oxide superconductor base layer 25 has a thin film shape, and is formed by the liquid phase epitaxial method described below using the solution described below containing the elements comprising both the seed layer 23 for the superconductor oxides and the main oxide intermediate layer 22. The thickness of the oxide superconductor base layer 25 is in a range of about 0.5–$\mu$m. For example, the thickness is about 1 $\mu$m. Since the oxide superconductor base layer 25 contains a small amount, for example, several percent of the elements comprising the main oxide intermediate layer 22, the superconductive property of the oxide superconductor base layer 25 is inferior to that of the oxide superconductor layer 26 described below. However, it is useful as a base layer for growing the oxide superconductor layer 26 by the liquid phase epitaxial method. Therefore, it is sufficient for the oxide superconductor base layer 25 to be in the thin film. In addition, due to a thin film, it is possible to increase the film formation rate when the liquid phase epitaxial method is carried out.

The oxide superconductor layer 26 is made of the same superconductor oxides as those of the above-mentioned seed layer 23 for the superconductor oxides, and is formed so as to be in a thick film by the liquid epitaxial method described below. The oxide superconductor layer 26 is a main superconductor layer which allows an electrical current to flow. The thickness of the oxide superconductor layer 26 can be adjusted, for example, in a range of 1–10 $\mu$m.

Figure 7:
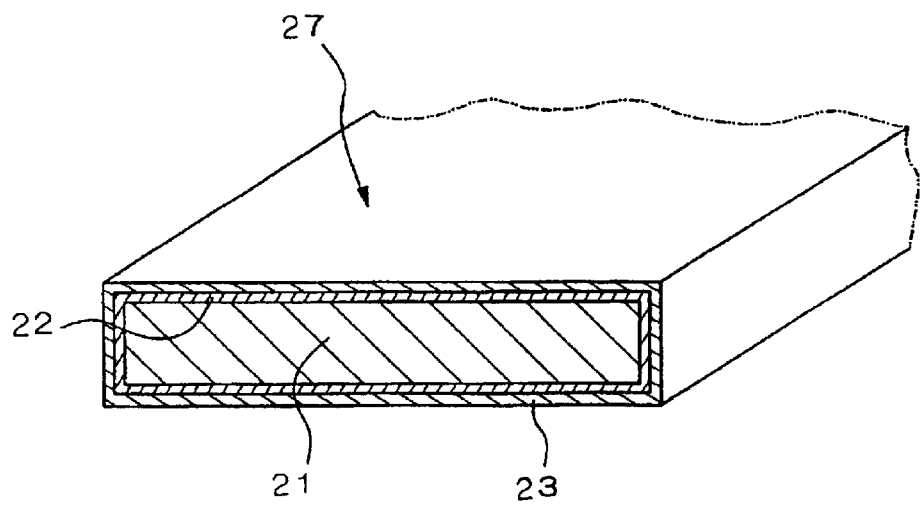
FIG. 7 is a cross sectional drawing showing an embodiment of a base substrate for preparing the oxide superconductor shown in FIG. 6.

In order to prepare the oxide superconductor A2 shown in FIG. 6, first, a base substrate 27 shown in FIG. 7 is prepared. The base substrate 27 is formed by forming the main oxide intermediate layer 22 on the periphery of the substrate 21, and forming the seed layer 23 for the superconductor oxides on the main oxide intermediate layer 22.

In order to prepare the main oxide intermediate layer 22 on the periphery of the substrate 21, a vapor phase method, such as the laser deposition method, is adopted. It is not necessary for the main oxide intermediate layers 22 to have a thickness which is larger than that of the oxide superconductor layer 26 prepared in the following steps. In order to adjust the crystalline orientation of the seed layer 23 for the superconductor oxides, the thickness of the main oxide intermediate layers 22 may be in a range of about 0.1–3 $\mu$m. Therefore, the thickness of the main oxide intermediate layer 22 can be adjusted to about 1 $\mu$m by a vapor phase method, such as the CVD method, the sputtering method, the laser deposition method, and the like.

Next, the seed layer 23 for the superconductor oxides is formed on the periphery of the main oxide intermediate layer 22 by a vapor phase method, such as the CVD method, the sputtering method, the laser deposition method, and the like. This seed layer 23 for the superconductor oxides should be a seed for growth when the thick film oxide superconductor layer is prepared from a solution by the liquid phase epitaxial method described below. Therefore, it is not necessary to increase the thickness of the seed layer 23. The thickness may be in a range of about 0.01 $\mu$m (10 nm)–1 $\mu$m, which is easily formed by a vapor phase method. For example, the thickness may be 1 $\mu$m. Therefore, the seed layer 23 for the superconductor oxides is easily formed by a vapor phase method on the base substrate 21 which has a long length. It is necessary for the composition of the seed layer 23 for superconductors to be substantially the same as that of the objective oxide superconductor layer 26. For example, when the oxide superconductor layer 26 represented by $Y_1Ba_2Cu_3O_y$ is prepared by the liquid phase epitaxial method described below, it is necessary to adjust the composition of the seed layer 23 for the superconductor oxides to be $Y_1Ba_2Cu_3O_y$.

In order to form the oxide superconductor base layer 25 on the seed layer 23 for the superconductor oxides, the liquid phase epitaxial method is adopted, in which the base substrate 27 provided with the main oxide intermediate layer 22 and the seed layer 23 for the superconductor oxides is immersed in a solution of superconductor oxides and is then pulled up from the solution.

Figure 8:
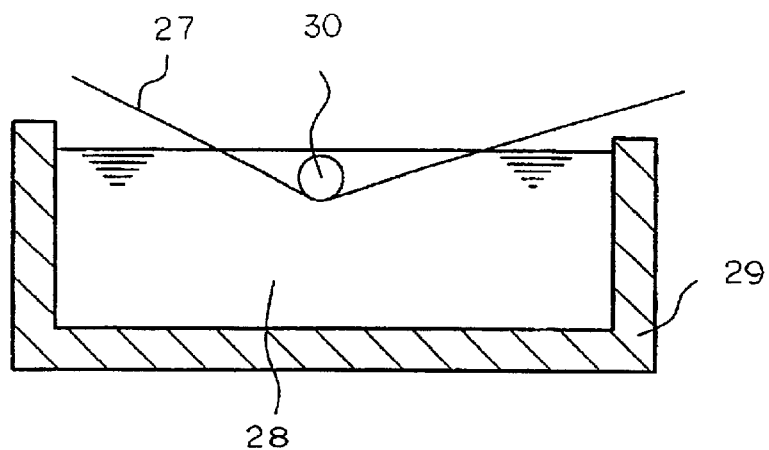
FIG. 8 shows the state of the first liquid phase epitaxial method in which a base substrate in a tape shape which is provided with a seed layer for the superconductor oxides is put into a solution and is then pulled up from the solution.
Figure 9:
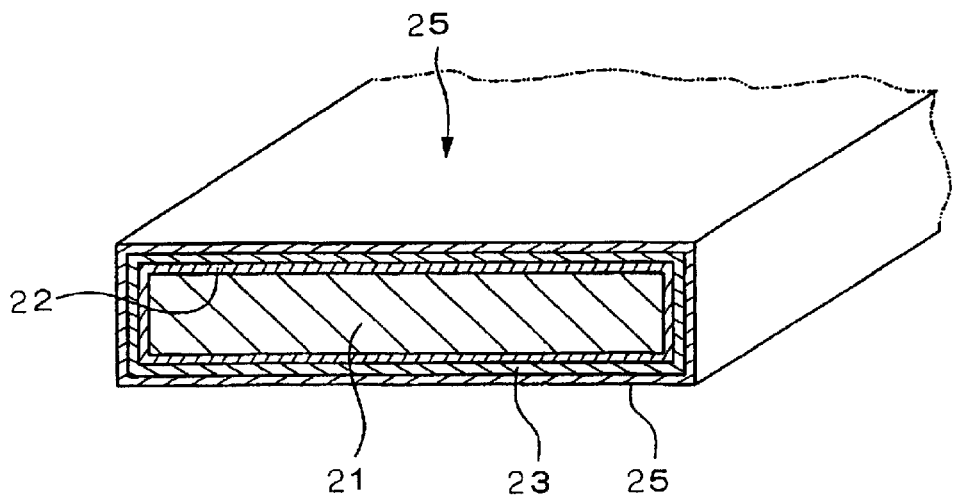
FIG. 9 is a cross sectional drawing showing the seed layer on which an oxide superconductor base layer is formed by the first liquid phase epitaxal method.

In order to carry out the liquid phase epitaxial method, for example, as shown in FIG. 8, a vessel 29 is filled with a solution 28 which is obtained by adding a saturation amount of the elements comprising the main oxide intermediate layer into a solution having a similar composition to that of the superconductor oxides, the base substrate 27 is put into the solution 28, and is then gradually pulled up from the solution 28.

When the main oxide intermediate layer 22 is made of MgO, and the oxide superconductor layer 26 is made of materials represented by $Y_1Ba_2Cu_3O_y$, in order to form the oxide superconductor base layer 25, for example, as the solution 28, a solution can be used which is prepared by putting a powder having a composition represented by $Y_2BaCuO_5$ (abbreviated as "Y211") at the bottom of the vessel 29, putting a mixture having a composition represented by $3BaCuO_2+2CuO$ on the powder, thereby adjusting the composition of the whole to be Y: Ba: Cu=6: 36: 58, melting the whole, adding a saturation amount of Mg, that is, about 03 atom % of Mg as MgO, and melting.

Next, the bottom part of the solution 28 is heated to about 1,000° C. and the surface of the solution 28 is slightly cooled to about 980° C. A temperature difference of 20° C. is created between the surface temperature and the bottom temperature of the solution 28. A roller 30, which is made of heat resistant materials, is provided in the solution 28 near the surface of the solution 28. The base substrate 27 is immersed into the solution 28 so as to pass through the upper part of the solution 28 via the roller 30. The roller 30 may be made of a ceramic which has a tolerance with respect to the solution 28, such as $BaZrO_3$, and the like.

Due to this operation, the components of the solution 28 adhere to the surface of the base substrate 27 passing through the upper part of the solution 28, and the oxide superconductor base layer 25 of which the composition is represented by $Y_1Ba_2(Cu_{1-x}Mg_x)_3O_y$ and which has a well-ordered crystalline orientation, grows at the surface of the base substrate 27 using the seed layer 23 for the superconductor oxides as a seed crystal. This is because the bottom part of the solution 28 is a high temperature region and the upper part of the solution 28 is a low temperature region; therefore, a convective fluid flow is generated from the bottom to the top. When the supersaturated solution at the bottom part reaches the upper low temperature region, the supersaturated components selectively crystallize easily. When the base substrate 27 provided with the seed layer 23 for superconductors passes through the low temperature region, crystal growth from the seed layer 23 is expedited.

Moreover, the thickness of the oxide superconductor base layer 25 may be smaller than that of the oxide superconductor layer 26 which is prepared by the following steps and may substantially equal that of the main oxide intermediate layer 22 and the seed layer 23 for the superconductor oxides. When the base substrate 27 is immersed into the solution 28 of which the temperature is high, such as 980–1,000° C., in order to prevent the main oxide intermediate layer 22 from dissolving in the solution 28, MgO is added to the oxide superconductor base layer 25.

If MgO is added to the solution 28 so as to reach saturation, when MgO contained in the main oxide intermediate layer 22 reacts with the solution 28, there is little possibility that MgO contained in the main oxide intermediate layer 22 will dissolve into the solution 28, and that the main oxide intermediate layer 22 will be damaged. In addition, when the dissolution amount of the added MgO is too large, there is a possibility that the oxide superconductor base layer 25 will not be formed by the liquid phase epitaxial method. However, as explained above, the saturation dissolution amount of Mg is small, such as 0.3 atom %. Therefore, a problem does not arise when the oxide superconductor base layer 25 is grown by the liquid phase epitaxial method.

Due to these reasons, the elements which are added in the solution 28 so as to reach saturation are the elements comprising the main oxide intermediate layer 22.

Next, in order to prepare the oxide superconductor layer 26 on the oxide superconductor base layer 25, a second liquid phase epitaxial method is carried out, in which the base substrate 27 provided with the main oxide intermediate layer 22, the seed layer 23 for the superconductor oxides, and the oxide superconductor base layer 25 is immersed in a solution of the superconductor oxides and is then pulled up from the solution.

Figure 10:
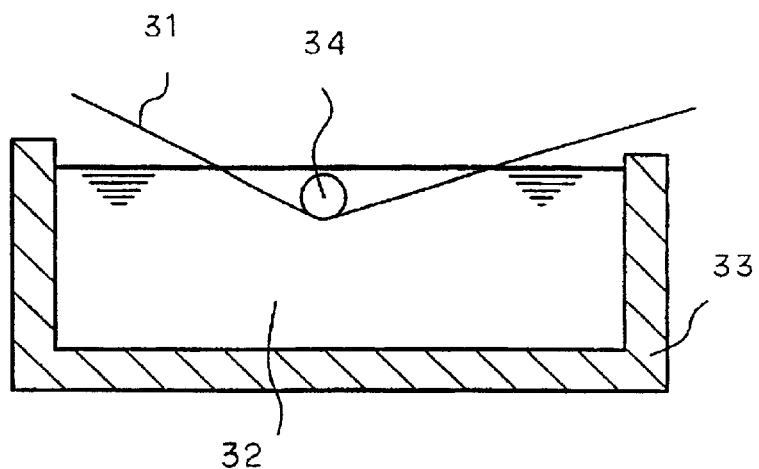
FIG. 10 shows the state of the second liquid phase epitaxial method in which a base substrate in a tape shape which is provided with an oxide superconductor base layer is put into a solution and is then pulled up from the solution.
Figure 11:
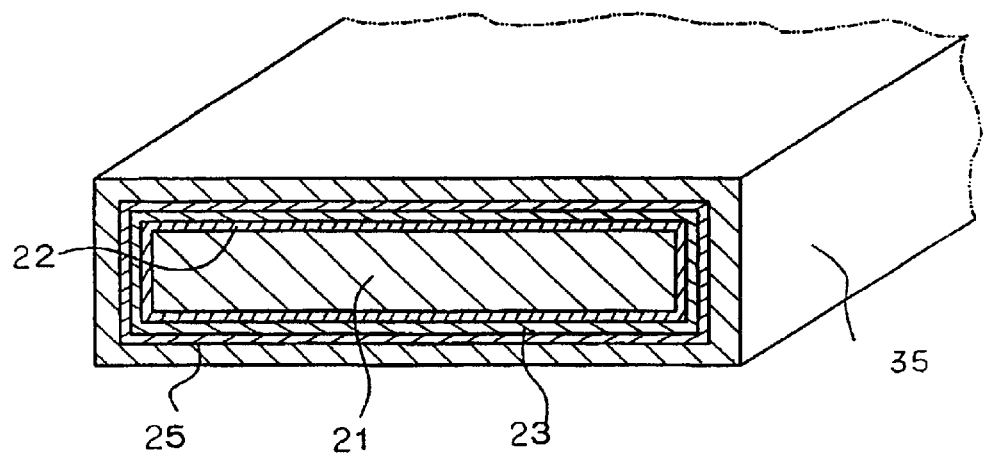
FIG. 11 is a cross sectional drawing showing a base substrate provided with a raw oxide superconductor layer which is prepared by the second liquid phase epitaial method.

In order to carry out the second liquid phase epitaxial method, for example, as shown in FIG. 10, a vessel 33 is filled with a solution 32 having a similar composition to that of the superconductor oxides, the base substrate 27 provided with the oxide superconductor base layer 25 is immersed into the solution 32 and is then gradually pulled up from the solution 32.

When the oxide superconductor layer 26 is represented by $Y_1Ba_2Cu_3O_y$, for example, as the solution 32, a solution can be used which is prepared by putting a powder having a composition represented by $Y_2BaCuO_5$ (abbreviated as "Y211") at the bottom of the vessel 33, putting a mixture having a composition represented by $3BaCuO_2+2CuO$ on the powder, thereby adjusting the composition of the whole to be Y: Ba: Cu=6: 36: 58, and melting. Moreover, it is preferable for the solution 32 to contain dissolving components at a saturation condition.

Next, the bottom part of the solution 32 is heated to about 1,000° C. and the surface of the solution 32 is slightly cooled to about 980° C. A temperature difference of 20° C. is created between the surface temperature and the bottom temperature of the solution 32. A roller 34, which is made of heat resistant materials, is provided in the solution 32 near the surface of the solution 32. The base substrate 27 is immersed into the solution 32 so as to pass through the upper part of the solution 32 via the roller 34. The roller 34 may be made of a ceramic which has a tolerance with respect to the solution 32, such as $BaZrO_3$.

Due to these operations, the components of the solution 32 adhere to the surface of the base substrate 27 passing through the upper part of the solution 32, and the raw oxide superconductor layer 35 of which the composition is represented by $Y_1Ba_2Cu_3O_y$ and which has a well-ordered crystalline orientation, grows at the surface of the base substrate 27 using the oxide superconductor base layer 25 as a seed crystal. This is because the bottom part of the solution 32 is a high temperature region and the upper part of the solution 32 is a low temperature region; therefore, a convective fluid flow is generated from the bottom to the top. When the supersaturated solution at the bottom part reaches the upper low temperature region, the supersaturated components selectively crystallize easily. When the base substrate 27 provided with the oxide superconductor base layer 25 passes through the low temperature region, crystal growth from the oxide superconductor base layer 25 is expedited.

The thick film raw oxide superconductor layer 35 prepared by these steps is heated to 350–600° C., and preferably in an oxygen atmosphere for several hours to several hundreds of hours. Thereby, oxygen is sufficiently supplied to the raw oxide superconductor layer 35, and the crystalline structure thereof is well-ordered. Thereby, the raw oxide superconductor layer 35 is converted into the oxide superconductor layer 26. Based on this, the oxide superconductor A2 comprising the oxide superconductor layer 26 has an excellent crystalline orientation and a large thickness which substantially equals that of the oxide superconductor layer shown in FIG. 6.

When the oxide superconductor layer 26 is formed by the liquid phase epitaxial method explained above, a thick film oxide superconductor layer 26 having a large thickness of about 2–10 μm can be formed remarkably quickly, for example, at a film formation rate of about 1 μm/min. Moreover, the film formation rate of the CVD method, which is known as a method having a relatively high film formation rate, is about 0.01 μm/min. Therefore, it is easily understood that the film formation rate of the liquid phase epitaxial method is remarkably high.

EXAMPLES

Example 1

On the top and bottom surfaces and the right and left sides of a substrate tape which has a width of 10 mm, a thickness of 0.2 mm, and a length of 1,000 μm, and is made of a non-orientated HASTELLOY C alloy containing 60% of Ni, 15% of Cr, 15% of Mo, 5% of Fe, 2.5% of Co, and less than 1% of minor elements as a remainder, the first intermediate layer, which has a thickness of 1 μm and in which the (100) plane of MgO is orientated, was formed by a laser deposition method using MgO as a target. Next, the second intermediate layer, which has a thickness of 1 μm and in which the (100) plane of $BaZrO_3$ is orientated, was formed on the first intermediate layer by a laser deposition method using $BaZrO_3$ as a target. Thereby, the base substrate was obtained.

In order to prepare the first and second intermediate layers on the periphery of the tape substrate made of the HASTELLOY C alloy, after the first intermediate layer was formed on one side of the tape substrate, the tape substrate was reversed, and then the first and second intermediate layers were formed on the other side of the tape substrate by a laser deposition again. When the laser deposition was carried out, the first and second intermediate layers were formed on the right and left sides of the tape substrate by wraparound deposition of laser deposition particles.

As the laser deposition method, a deposition method was adopted in which an excimer laser irradiates the targets in a reduced pressure atmosphere, such as $1 \times 10^{-8}$ MPa, and thereby the target particles were allowed to evaporate and deposit on the substrate tape.

In addition, on the second intermediate layer, a seed film for the superconductor oxides having a thickness of 1 μm was formed by the same laser deposition method as explained above using a target represented by the general formula $Y_1Ba_2Cu_3O_{7-x}$. Since the (100) plane of the second intermediate layer which functions as a base film for the seed film for the superconductor oxides was orientated, the seed film for the superconductor oxides, which was formed on the second intermediate layer by a film formation method, was formed, also having a well-ordered crystalline structure.

Next, a powder represented by $Y_2BaCuO_5$ (abbreviated as "Y211") was put at the bottom of a vessel made of yttria, a mixture having a composition represented by $3BaCuO_2+2CuO$ was put on the powder, thereby adjusting the composition of the whole to be Y: Ba: Cu=6: 36: 58, the whole was heated by a heating device, the powder and the mixture were melted, and a solution was obtained. Moreover, the composition of the solution is different from that of the objective superconductor oxides containing Y. However, the present inventors confirmed from several experiments that it is possible to carry out crystal growth of the oxide superconductor layer represented by $Y_1Ba_2Cu_3O_y$ by passing the seed film through a solution having such a composition.

Next, a liquid phase epitaxial method was carried out, in which the base substrate was immersed gradually in the solution from the edge portion thereof and was gradually pulled up at 1 mm/sec. Due to this treatment, a raw oxide superconductor layer having a thickness of 5 μm was formed on the seed layer for the superconductor oxides.

An oxide superconductor, which has a length of 1,000 mm, a thickness of 5 μm, and a composition represented by $Y_1Ba_2Cu_3O_y$, was obtained by heat treating the sample in an oxygen atmosphere at 500° C. for 400 hours.

When the obtained oxide superconductor was cooled using liquid nitrogen, and the critical current value thereof was measured by a four probe method in a non-magnetic field, an electrical current of 500 A was able to flow.

Next, in order to make a comparison, a film was formed on the base substrate comprising the tape substrate, which is made of a HASTELLOY alloy and is the same as that used in the above-mentioned process, and the first and second intermediate layers, by a CVD method which was carried out in a reduced pressure atmosphere, such as $1\times10^{-4}$ MPa, for 2 hours while the base substrate was moving. Thereby, an oxide superconductor layer having a thickness of 1 μm and a length of 10 cm was obtained. When the obtained oxide superconductor was cooled using liquid nitrogen, and the critical current value thereof was measured by a four probe method in a non-magnetic field, an electrical current of 100 A was able to flow.

From the above, it was cleared that the present invention can prepare an oxide superconductor which has a large length and comprises a thick film oxide superconductor layer having a high critical current value at a film formation rate which is remarkably higher than that of the CVD method.

Example 2

On the top and bottom surfaces and the right and left sides of a substrate tape which has a width of 10 mm, a thickness of 0.2 mm, and a length of 1,000 mm, and is made of a non-orientated HASTELLOY C alloy containing 60% of Ni, 15% of Cr, 15% of Mo, 5% of Fe, 2.5% of Co, and minor elements as a remainder, the main oxide intermediate layer which has a thickness of 1 μm and in which the (100) plane of MgO is orientated, was formed by a laser deposition method using MgO as a target, and thereby the base substrate was obtained. In order to prepare the main oxide intermediate layer on the periphery of the tape substrate made of the HASTELLOY C alloy, after the first intermediate layer was formed on one side of the tape substrate, the tape substrate was reversed, and then laser deposition was carried out again at the other side of the tape substrate. When the laser deposition was carried out, the first and second intermediate layers were formed on the right and left sides of the tape substrate by wraparound deposition of laser deposition particles, and thereby the base substrate shown in FIG. 2 was obtained.

As the laser deposition method, a deposition method was adopted in which an excimer laser irradiates the targets in a reduced pressure atmosphere, such as $1\times10^{-8}$ MPa, and thereby the target particles were allowed to evaporate and deposit on the substrate tape.

Next, a powder represented by $Y_2BaCuO_5$ (abbreviated as "Y211") was put at the bottom of a vessel made of yttria, a mixture having a composition represented by $3BaCuO_2+2CuO$ was put on the powder, thereby adjusting the composition of the whole to be Y: Ba: Cu=6: 36: 58, the whole was heated by a heating device, the powder and the mixture were melted, and a solution was obtained. A saturation amount, that is, 0.3 atom % of MgO powder was dissolved in the solution, and a solution, in which Mg is saturated, was obtained.

Next, a first liquid phase epitaxial method was carried out, in which the base substrate was immersed gradually in the solution from the edge portion thereof, and was then gradually pulled up at 5 mm/sec. Due to this treatment, an oxide superconductor base layer having a thickness of 1 μm was formed on the main oxide intermediate layer.

Next, a second liquid phase epitaxial method was carried out, using a solution which does not contain Mg different from the solution used above, the base substrate was immersed gradually in the solution from the edge portion thereof, and was then pulled up at 1 mm/sec. Due to this treatment, a raw oxide superconductor layer having a thickness of 5 μm was formed on the oxide superconductor base layer.

An oxide superconductor, which has a length of 1,000 mm, a thickness of 5 μm, and a composition represented by $Y_1Ba_2Cu_3O_y$, was obtained by heat treating the sample in an oxygen atmosphere at 500° C. and for 400 hours.

Moreover, the composition of the solution is different from that of the objective superconductor oxides containing Y. However, the present inventors confirmed from several experiments that it is possible to carry out crystal growth of the oxide superconductor layer represented by $Y_1Ba_2Cu_3O_y$ by passing the seed layer for the superconductor oxides through a solution having such a composition.

When the obtained oxide superconductor was cooled using liquid nitrogen, and the critical current value thereof was measured by a four probe method in a non-magnetic field, an electrical current of 500 A was able to flow.

Next, in order to make a comparison, a film was formed on the base substrate comprising the tape substrate, which is made of a HASTELLOY alloy and is the same as that used in the above-mentioned process, and the first and second intermediate layers, by a CVD method which was carried out in a reduced pressure atmosphere, such as $1\times10^{-4}$ MPa, for 2 hours while the base substrate was moving. Thereby, an oxide superconductor layer having a thickness of 1 μm and a length of 10 cm was obtained. When the obtained oxide superconductor was cooled using liquid nitrogen, and the critical current value thereof was measured by a four probe method in a non-magnetic field, an electrical current of 100 A was able to flow.

From the above, it was clarified that the present invention can prepare an oxide superconductor which has a large length and comprises a thick film oxide superconductor layer having a high critical current value at a film formation rate which is remarkably higher than that of the CVD method.

INDUSTRIAL APPLICABILITY

As explained above, the oxide superconductor of the present invention comprises a substrate, an oxide intermediate layer, and a thick film oxide superconductor layer which is prepared by a liquid phase epitaxial method, and the thick film oxide superconductor layer, which is formed on the oxide intermediate layer by the liquid phase epitaxial method, has a thickness which is larger than that of an oxide superconductor layer prepared by a conventional vapor phase method. Therefore, the present invention can prepare an excellent oxide superconductor at a high productivity, and which has a critical current which is larger than that of an oxide superconductor comprising an oxide superconductor layer which prepared by a conventional vapor phase method.

In addition, when the oxide intermediate layer comprises a first intermediate layer having a low reactivity to the substrate and a second intermediate layer having a low reactivity to the solution, and the oxide superconductor layer is prepared by immersing the substrate and the oxide intermediate layer into the solution by a liquid phase epitaxial method, the oxide intermediate layer prevents the substrate from melting into the solution. Therefore, when the oxide superconductor layer is prepared from the solution by the liquid phase epitaxial method, it is possible to prepare the oxide superconductor layer without damage to the substrate. In addition, when the second intermediate layer is made of materials having a low reactivity to the first intermediate layer, there is little possibility that the first and second intermediate layers react during the liquid phase epitaxial method. Therefore, when they are immersed in the solution at a high temperature during the liquid phase epitaxial method, it is possible to prepare a thick film oxide superconductor layer having a high critical current value without damage to the substrate, the first intermediate layer, and the second intermediate layer.

In addition, when the seed film for the oxide superconductor layer, which is formed on the second intermediate layer, is allowed to grow by a liquid phase epitaxial method, and is converted into the thick film oxide superconductor layer, and when the crystalline orientation of the seed film is excellent such that it is adjusted to that of the second intermediate layer, the crystalline orientation of the thick film oxide superconductor layer which is prepared by growth of the seed film is also excellent. Therefore, it is possible to prepare an oxide superconductor comprising a thick film oxide superconductor layer having an excellent crystalline orientation.

If the substrate is made of metals having a high melting temperature, such as an Ni alloy and a Zr alloy, heat resistance and corrosion resistance of the substrate are certainly obtained. If the first intermediate layer is made of oxides containing Ni, Mg, Ba, or Zr, the reaction between the substrate and the first intermediate layer can be prevented when the first intermediate layer is immersed in the solution and thereby is heated at a high temperature. If the second intermediate layer is made of oxides of Ba, the resistance to the solution of the second intermediate layer when the second intermediate layer is immersed into the solution can be certainly obtained.

In the present invention, when the substrate is made of metals having a high melting temperature, such as an Ni alloy, the first intermediate layer is made of MgO, the second intermediate layer is made of $BaZrO_3$, and the oxide superconductor layer has a composition represented by the general formula REBaCuO, wherein RE denotes at least one element selected from the group consisting of Y, Nd, Sm, Eu, Er, Dy, Gd, Ho, Tm, and Yb, it is possible to effectively increase the resistance to the solution of the substrate by the first and second intermediate layers. Therefore, it is possible to provide an oxide superconductor which has a high critical current and which comprises an oxide superconductor layer having a critical temperature which is higher than the liquid nitrogen temperature.

Next, when the substrate is made of metals having a high melting temperature, the first intermediate layer is made of materials having a low reactivity to the substrate, and the second intermediate layer is made of materials having a low reactivity to the solution, and when the oxide superconductor layer is formed on the second intermediate layer by a liquid phase epitaxial method in which they are immersed into the solution for the oxide superconductor layer and are then pulled up from the solution, it is possible to prepare the oxide superconductor layer without damage to the substrate, the first intermediate layer, and the second intermediate layer by the solution. Therefore, the base substrate of the present invention is effective for preparing the oxide superconductor which comprises a thick film oxide superconductor layer having a desired composition by the liquid phase epitaxial method in which they are immersed in the solution at a high temperature.

According to the manufacturing method of the present invention, it is possible to prepare an oxide superconductor comprising a thick film oxide superconductor layer by a liquid phase epitaxial method in which the substrate provided with the oxide intermediate layer is immersed in the solution containing the elements comprising the oxide superconductor layer. In addition, since the oxide intermediate layer protects the substrate from the solution, the substrate will not be damaged when it is immersed in the solution, and an oxide superconductor comprising the substrate which is not damaged can be provided.

It is preferable for the oxide intermediate layer to comprise the first intermediate layer and the second intermediate layer, the first intermediate layer to be made of materials having a low reactivity to the substrate; and the second intermediate layer to be made of materials having a low reactivity to the first intermediate layer and the solution. When the substrate is made of metals having a high melting temperature, such as an Ni alloy and a Zr alloy, heat resistance and corrosion resistance of the substrate are certainly obtained. When the first intermediate layer is made of oxides containing Ni, Mg, Ba or Zr, even when it is immersed in the solution and is heated to a high temperature, the reaction between the substrate and the first intermediate layer can be prevented. When the second intermediate layer is made of oxides of Ba, the resistance to the solution of the second intermediate layer when the second intermediate layer is immersed into the solution can be certainly obtained.

In addition, when the seed film for the oxide superconductor layer, which is formed on the second intermediate layer, is grown by the liquid phase epitaxial method, a thick film oxide superconductor layer is formed, and crystalline orientation of the seed film is excellent such that it is adjusted to that of the second intermediate layer, and the crystalline orientation of the oxide superconductor layer which is prepared by growth of the seed film is excellent.

As explained above, the oxide superconductor of the present invention comprises a substrate, a main oxide intermediate layer, and a thick film oxide superconductor layer which is prepared by a liquid phase epitaxial method, and the thick film oxide superconductor layer which is formed on the main oxide intermediate layer by a liquid phase epitaxial method, has a thickness which is larger than that of an oxide superconductor layer prepared by a conventional vapor phase method. Therefore, the present invention can prepare an excellent oxide superconductor at a high productivity, and which has a critical current which is larger than that of an oxide superconductor comprising an oxide superconductor layer prepared by a conventional vapor phase method.

In addition, since the oxide superconductor base layer contains the elements comprising the main oxide intermediate layer, when the oxide superconductor base layer is prepared by the liquid phase epitaxial method, a solution containing the elements comprising the oxide intermediate layer can be used. When the solution is used and the substrate provided with the main oxide intermediate layer is immersed in the solution, the oxide superconductor base layer can be prepared without dissolution of the elements comprising the main oxide intermediate layer in the solution. Therefore, when the oxide superconductor base layer is prepared by the liquid phase epitaxial method, the oxide superconductor base layer can be prepared without damage to the substrate. In addition, since the oxide superconductor base layer is prepared on the substrate which is not damaged, based on the oxide superconductor base layer, the thick film oxide superconductor layer can be obtained by the liquid phase epitaxial method.

In addition, when the seed layer for the superconductor oxides is formed on the main oxide intermediate layer under conditions wherein the crystalline orientation thereof is excellent, the crystalline orientation of the oxide superconductor base layer prepared by the liquid phase epitaxial method can be excellent. When the oxide superconductor layer is prepared by the liquid phase epitaxial method based on this prepared oxide superconductor base layer, it has excellent crystalline orientation and critical current.

When the substrate is made of metals having a high melting temperature, such as an Ni alloy and a Zr alloy, heat resistance and corrosion resistance of the substrate can be certainly obtained. When the main oxide intermediate layer is made of oxides, such as MgO or NiO, and when the main oxide intermediate layer is immersed the solution and thereby is heated at a high temperature, a reaction between the substrate and the main oxide intermediate layer can be prevented. In addition, resistance to the solution of the main oxide intermediate layer when the liquid phase epitaxial method is carried out can be certainly obtained.

Next, it is preferable for the oxide superconductor layer to be made of superconductor oxides represented by the formula REBaCuO, wherein RE denotes at least one element selected from the group consisting of Y, Nd, Sm, Eu, Er, Dy, Gd, Ho, Tm, and Yb. Due to this, the oxide superconductor having a critical temperature which is higher than the liquid nitrogen temperature, and a high critical current can be obtained.

In addition, according to the manufacturing method of the present invention, it is possible to prepare the oxide superconductor comprising the thick film oxide superconductor layer of which the crystalline orientation is excellent by a liquid phase epitaxial method in which the substrate provided with the main oxide intermediate layer is immersed in the solution containing the elements comprising both the oxide superconductor layer and the main oxide intermediate layer, and thereby the oxide superconductor base layer is prepared, and the substrate provided with the oxide superconductor base layer is immersed in the solution containing the elements comprising the oxide superconductor layer.

When the liquid phase epitaxial method is carried out, and when the substrate provided with the main oxide intermediate layer is immersed in the solution containing the elements comprising the main oxide intermediate layer, the oxide superconductor base layer can be prepared on the main oxide intermediate layer without dissolution of the elements comprising the main oxide intermediate layer into the solution and damage to the substrate and the main oxide intermediate layer. In addition, since the oxide superconductor base layer can be prepared under conditions wherein the substrate and the main oxide intermediate layer are not damaged and the oxide superconductor layer can be prepared by the liquid phase epitaxial method based on the oxide superconductor base layer, the oxide superconductor comprising the oxide superconductor layer which can flow a high critical current and has an excellent crystalline orientation can be obtained.

When the substrate is made of metals having a high melting temperature, such as an Ni alloy and a Zr alloy, heat resistance and corrosion resistance of the substrate can be certainly obtained. When the main oxide intermediate layer with oxides containing Mg or Ni, even when the main oxide intermediate layer is immersed the solution and thereby it is heated at high temperatures, a reaction between the substrate and the main oxide intermediate layer can be prevented. Therefore, the oxide superconductor having a high critical current comprising the substrate which is not damaged, can be obtained.

What is claimed is:

1. An oxide superconductor comprising:
   a substrate which is made of metals having a high melting temperature;
   a main oxide intermediate layer which is formed on at least one surface of said substrate;
   a seed layer for superconductor oxides which is formed on said main oxide intermediate layer;
   an oxide superconductor base layer which contains at least one element comprising said main oxide intermediate layer and is formed on said seed layer for superconductor oxides by a liquid phase epitaxial method; and
   a thick film oxide superconductor layer which is formed on said oxide superconductor base layer by a liquid phase epitaxial method.

2. An oxide superconductor according to claim 1, wherein said main oxide intermediate layer is made of MgO or NiO; and said oxide superconductor base layer which contains the elements comprising said main oxide intermediate layer contains MgO or NiO.

3. An oxide superconductor according to claim 1 or 2, wherein said substrate is made of an Ni alloy or a Zr alloy; and said main oxide intermediate layer is made of oxides containing a metal selected from the group consisting of Ni, Mg, Ba, and Zr.

4. An oxide superconductor according to claim 1 or 2, wherein said oxide superconductor layer has a composition represented by the general formula REBaCuO, wherein RE denotes at least one element selected from the group consisting of Y, Nd, Sm, Eu, Er, Dy, Gd, Ho, Tm, and Yb.

5. A manufacturing method for an oxide superconductor comprising the steps of:
   forming a main oxide intermediate layer and a seed layer for superconductor oxides on at least one surface of a substrate which is made of metals having a high melting temperature;

carrying out the liquid phase epitaxial method in which said substrate provided with said main oxide intermediate layer and said seed layer is put into a solution containing the elements comprising both said superconductor oxides and said main oxide intermediate layer and is then pulled up from said solution and thereby a thin film oxide superconductor base layer is formed on said seed layer for superconductor oxides;

carrying out the liquid phase epitaxial method in which the whole of the product prepared in the above steps is put into a solution containing the elements comprising said superconductor oxides and is then pulled up from said solution, and thereby a thick film raw oxide superconductor layer is formed on said oxide superconductor base layer; and heat treating said raw oxide superconductor layer and thereby said raw oxide superconductor layer is converted into a thick film oxide superconductor layer.

6. A manufacturing method according to claim 5, wherein said substrate is made of an Ni alloy or a Zr alloy; and said main oxide intermediate layer is made of oxides containing a metal selected from the group consisting of Ni, Mg, Ba, and Zr.

7. A manufacturing method according to claim 5 or 6, wherein said solution containing the elements comprising both said superconductor oxides and said main oxide intermediate layer is prepared by adding the elements comprising said main oxide intermediate layer in a solution containing the elements comprising said superconductor oxides so as to reach saturation.

8. A manufacturing method according to one of claims 5 to 7, wherein said solution is in a saturation condition.

* * * * *